United States Patent [19]

Wehner et al.

[11] Patent Number: 5,134,247
[45] Date of Patent: Jul. 28, 1992

[54] REDUCED CAPACITANCE CHIP CARRIER

[75] Inventors: Peter J. Wehner, Eau Claire; Paul M. Knudsen, Elk Mound; David F. Leonard, Chippewa Falls; Richard R. Steitz; David L. Duxstad, both of Eau Claire; Melvin C. August, Chippewa Falls; Delvin D. Eberlein, Altoona, all of Wis.

[73] Assignee: Cray Research Inc., Eagan, Minn.

[21] Appl. No.: 313,395

[22] Filed: Feb. 21, 1989

[51] Int. Cl.⁵ ............................................. H01L 23/13
[52] U.S. Cl. ................................. 174/52.4; 264/67; 357/74
[58] Field of Search ..................... 174/52.4; 357/74; 338/252, 311; 264/67

[56] References Cited

U.S. PATENT DOCUMENTS

| | | | |
|---|---|---|---|
| 2,395,295 | 2/1946 | Rowland | 264/67 |
| 3,484,534 | 12/1969 | Kilby et al. | 174/52.2 |
| 3,566,212 | 2/1971 | Marx | 357/80 |
| 3,617,819 | 11/1971 | Boisvert et al. | 357/71 |
| 3,668,299 | 6/1972 | McNeal | 556/416 |
| 3,760,090 | 9/1973 | Fowler | 174/52.3 |
| 4,026,412 | 5/1977 | Henson | 206/331 |
| 4,038,488 | 7/1977 | Lin | 174/52.4 |
| 4,142,203 | 2/1979 | Dietz | 357/80 |
| 4,362,902 | 12/1982 | Grabbe | 174/52.4 |
| 4,374,457 | 2/1983 | Wiech, Jr. | 437/218 |
| 4,594,770 | 6/1986 | Butt | 174/52.4 |
| 4,622,433 | 11/1986 | Frampton | 174/52.4 |
| 4,720,770 | 1/1988 | Jameson | 361/387 |
| 4,898,320 | 2/1990 | Dunaway et al. | 228/245 |
| 4,931,854 | 6/1990 | Yonemasu et al. | 357/4 |

FOREIGN PATENT DOCUMENTS

| | | |
|---|---|---|
| 0216699 | 4/1987 | European Pat. Off. |
| 0233085 | 8/1987 | European Pat. Off. |
| 2613536 | 10/1988 | France |
| 2118371 | 10/1983 | United Kingdom |

OTHER PUBLICATIONS

EP & P News in Electronics Manufacturing.
IBM Technical Disclosure Bulletin, vol. 17, No. 3-Aug. 1974 pp. 862-863-C. M. McIntosh et al. "Low Dielectric Constant Pockets In Multilayer Ceramic Modules".

Primary Examiner—Gerald P. Tolin
Assistant Examiner—David A. Tone
Attorney, Agent, or Firm—Merchant, Gould, Smith, Edell, Welter & Schmidt

[57] ABSTRACT

A ceramic chip carrier package for integrated circuits is described which provides reduced interlead capacitance. A cavity for the placement of the integrated circuit chip is centrally located on a substrate. The leads of the package are bridged between the cavity and the outer periphery of the substrate. The leads are bonded to the substrate using adhesive glass placed on the substrate at the outer periphery of the cavity and at the outer periphery of the substrate. Sealing glass is placed on the outer periphery of the substrate over the leads to provide a bonding material for a lid to the package. The area between the cavity and the outer periphery of the substrate has no adhesive or sealing glass which thus provides an air dielectric between the leads so that interlead capacitance is reduced. In a second preferred embodiment, a channel is provided in the ceramic substrate between the periphery of the cavity and the periphery of the substrate to control the flow of adhesive glass and sealing glass so that the glasses do not migrate onto the leads. Since the air dielectric constant is lower than the glass dielectric constant, the interlead capacitance is lower than that found in prior art packages.

21 Claims, 6 Drawing Sheets

REDUCED CAPACITANCE CHIP CARRIER

FIELD OF THE INVENTION

The present invention relates to packages for semiconductor integrated circuits, and in particular to ceramic chip carriers having lead frames with finite capacitive coupling between the leads.

BACKGROUND OF THE INVENTION

Integrated circuit packages typically consist of a plastic or ceramic substrate on which the integrated circuit is attached. The signal and power connections are made from the integrated circuit to conductive leads which span the distance between the interior of the chip carrier to the outer periphery or exterior to allow power and communication connections to be made to the circuitry outside the chip carrier. The conductive leads are typically manufactured as a group in a pattern described in the industry as a lead frame. In the construction of integrated circuit packages, it is common that a ceramic or plastic substrate is first manufactured and the lead frame is then bonded to the top of the substrate and the integrated circuit is attached to the center of the substrate. Bonding wires are then attached from the bonding pads of the integrated circuit to the conductive leads of the lead frame to make the electrical connections. Once the electrical connections are made a cap or cover for the substrate is bonded to the substrate covering the integrated circuit die, and a portion of the lead frame to form a hermetic seal. The outer portions of the leads are left exposed for connection to electrical circuitry external to the integrated circuit package.

There is a demand in the industry for increasingly dense circuitry on integrated circuit die and hence, increased numbers of pins on integrated circuit packages. Commensurate with this increased packing density is a demand for increased speed and performance from the integrated circuits. Increased packing density and speed of integrated circuits is a requirement of integrated circuit packages used in modern super-computers such as the type manufactured by Cray Research, Inc., the assignee of the present invention. Unfortunately decreased spacing between the leads on the lead frame placed on the substrate increases the capacitive coupling between the leads. This capacitive coupling has an adverse effect on the quality of signals which are transmitted on the leads. Capacitive loading on the leads may adversely affect the risetime, falltime, cause reflections, impedance mismatches, termination problems and a decrease in the speed at which signals may propagate into and out of the integrated circuit die as is well known to those skilled in the art. There is therefore a need in the prior art for an integrated circuit package which has an increased pin-out count with closely spaced leads of a lead frame, while at the same time having a reduced interlead capacitance. There is also a need in the prior art to carefully control the amount of interlead capacitance so that it falls within a predictable range of values.

SUMMARY OF THE INVENTION

To solve the problems described above found in the prior art, and to solve other problems that will be readily apparent to those skilled in the art upon reading and understanding the present specification, the present invention allows for closely spaced leads on a chip carrier with reduced and more controlled interlead capacitance.

The present invention describes a chip carrier in which the lead frame is placed on the outer periphery of a ceramic substrate and in which the center portion of the substrate contains a well or cavity for placement of the integrated circuit die. In a first embodiment, the sealing glass used to attach the lid of the chip carrier onto the substrate of the chip carrier, and the adhesive glass which is used to attach the lead frame to the substrate, is patterned so that glass is only attached to the leads at the outer periphery of the substrate and the inner periphery of the cavity of the substrate. In this configuration, there is an air gap between all of the leads of the frame providing an air dielectric between the leads which results in a reduced interlead compacitance.

In a second preferred embodiment of the present invention. A channel or trench is constructed between the outer periphery of the substrate, and the inner cavity of the substrate such that the integrated circuit leads bridge over the channel providing an air gap between the integrated circuit leads. Sealing glass is then placed on the outer periphery of the substrate for later bonding a lid to the substrate (to form a hermetic seal) and adhesive glass is placed on the outer periphery of the substrate and the outer periphery of the cavity to hold the leads of the lead frame in place during construction of the package. A lid is then placed on top of the substrate to hermetically seal the package and heat is applied to bond the sealing glass between substrate and the lid. The leads are thus bridged over the channel such that the interlead capacitance is a function of both the glass dielectric on the non-bridge portion of the leads and the air dielectric over the bridged portion of the leads. Since the air dielectric constant is lower than the glass dielectric constant, the overall interlead capacitance is lower than that found in the prior art. This reduced capacitance allows for fewer signal problems at higher switching speeds on the leads.

DETAILED DESCRIPTION OF THE DRAWINGS

In the drawings where like numerals refer to like components throughout the several views, FIG. 1 is a top down view of an integrated circuit chip carrier and lead frame of the prior art.

DETAILED DESCRIPTION OF THE PREFERRED EMBODIMENT

In the following detailed description of the preferred embodiments, references made to the accompanying drawings which form a part hereof, and in which is shown by way of illustration specific embodiments in which the present invention may be practiced. These preferred embodiments are described in sufficient detail to enable those skilled in the art to practice the invention, and it is to be understood that other embodiments may be utilized, and that structural or electrical changes may be made without departing from the spirit and scope of the present invention. The following detailed description is therefore, not to be taken in a limiting sense, and the scope of the present invention is defined by appended claims.

Figure 1:
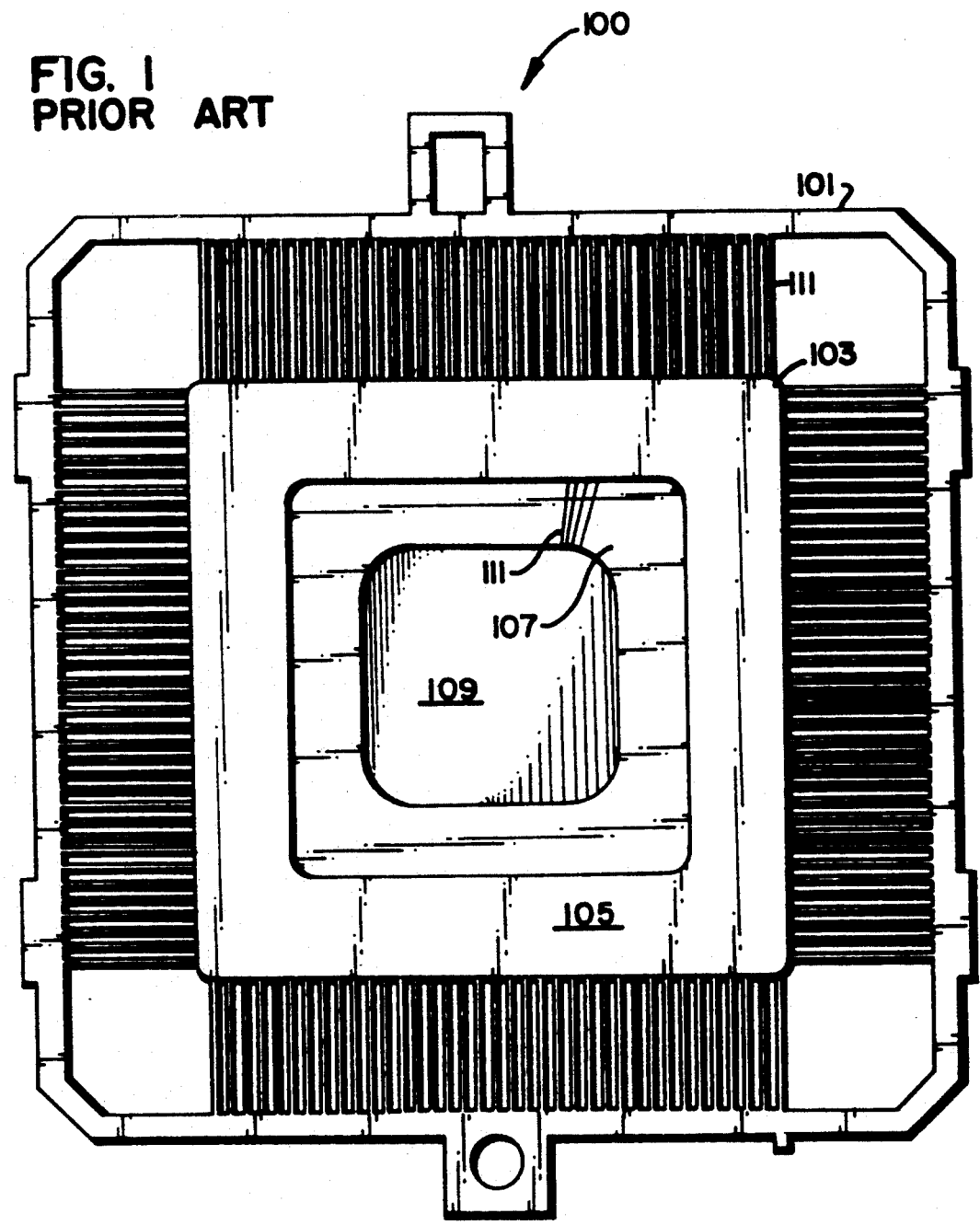
Figure 2:
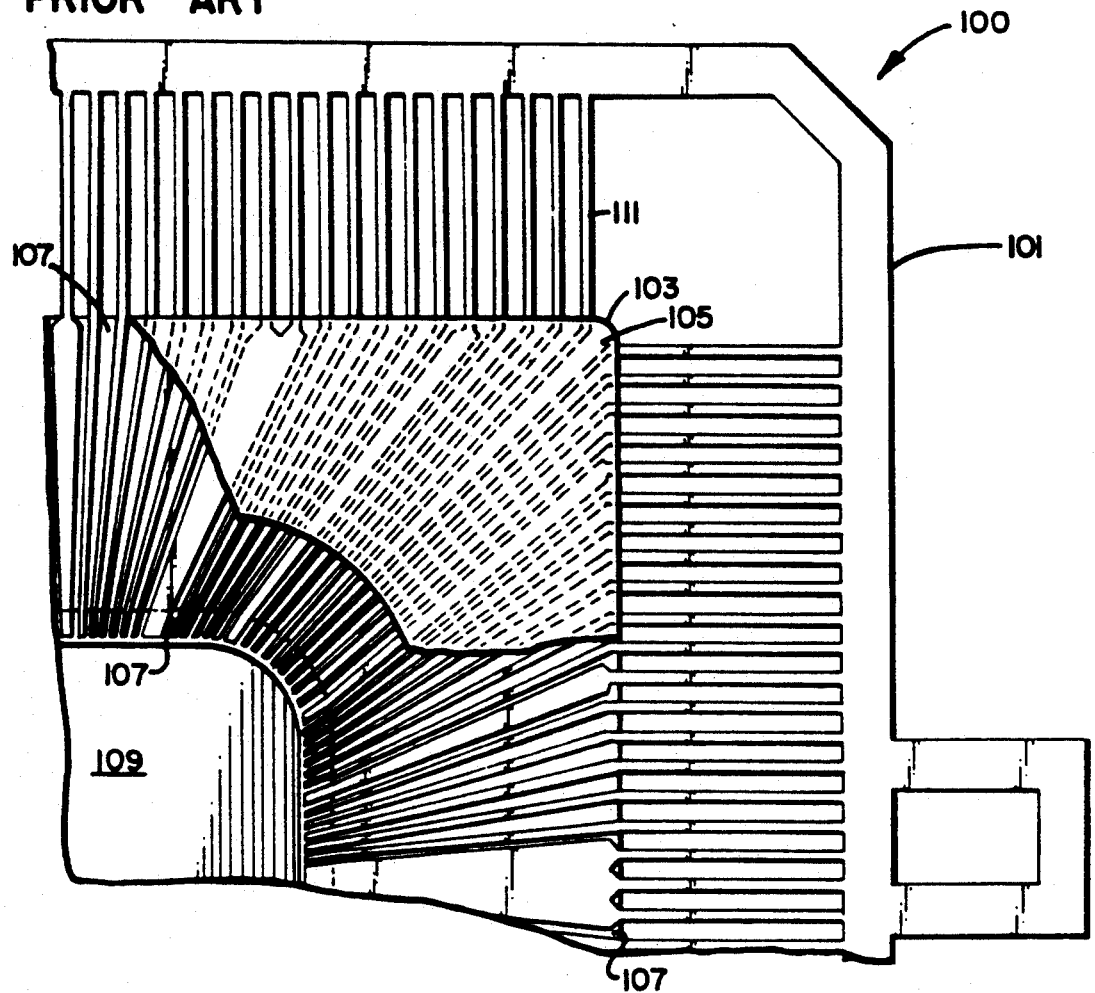
FIG. 2 is a detailed, cut away view of a portion of the prior art chip carrier of FIG. 1.
Figure 3:
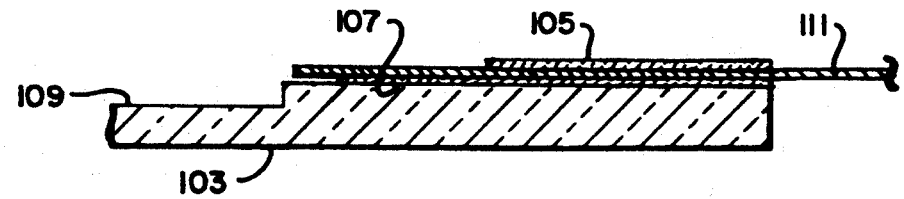
FIG. 3 is a cut-away side view of the prior art chip carrier of FIG. 2.

FIGS. 1-3 show a prior art integrated circuit chip carrier 100 before the integrated circuit die is attached, before the lid is sealed to the substrate, and before the periphery of the lead frame is trimmed from the leads 111. The substrate 103 is typically constructed of ceramic, however, other materials are often used, such as plastics. A central cavity 109 is constructed in the center of the substrate 103 so that an integrated circuit die (not shown) may be placed in the recess and bonded therein. The lead frame serves to rigidly support the leads 111 for positioning. The leads contact the edge of cavity 109 and are brought out past the periphery of the substrate 103 where they are rigidly held in position by outer frame 101.

During construction of the integrated circuit chip carrier, the leads of the lead frame are held in position with a thin layer of adhesive glass 107, such as Dow Corning 7583. In lieu of adhesive glass, other bonding materials or adhesives may be used to hold the leads in position. The leads are placed directly upon the top surface of the ceramic substrate 103, and are held in position by glass or adhesive 107. Between the inner adhesive glass 107 and the outer periphery of ceramic substrate 103, sealing glass 105 such as Kyocera KC400 is placed over the leads of the lead frame. This sealing glass 105 is used to bond the lid of the integrated circuit chip carrier to the substrate 103 to form a hermetic seal. The actual bonding process is done in an oven which raises the temperature to a point causing the sealing glass 105 to bond to both the lid and the substrate. The melting point of the adhesive glass 107 is higher than the melting point of the sealing glass 105 so that the leads are not disturbed during the heating process to bond the lid.

The interlead capacitance of each lead 111 is primarily a function of the spacing of the leads and the dielectric constant of the sealing glass 105 covering the leads 111. For the integrated circuit chip carrier 100 shown in FIGS. 1-3, a lead 111 traverses an area of sealing glass approximately 300 mils wide. The spacing between the leads 111 varies around the perimeter of the substrate (due to bonding at the corners) and tapers from 6 mils wide with 6 mils spacing at the periphery of the cavity 109 to 9 mils wide with 21 mils spacing at the substrate periphery. Thus, for the prior art chip carrier of FIGS. 1-3, the interlead capacitance is approximately 3 picofarads to each adjacent pin. This amount of capacitance between each pin results in crosstalk, reflections and combinations of crosstalk and reflections at high switching speeds.

Figure 4:
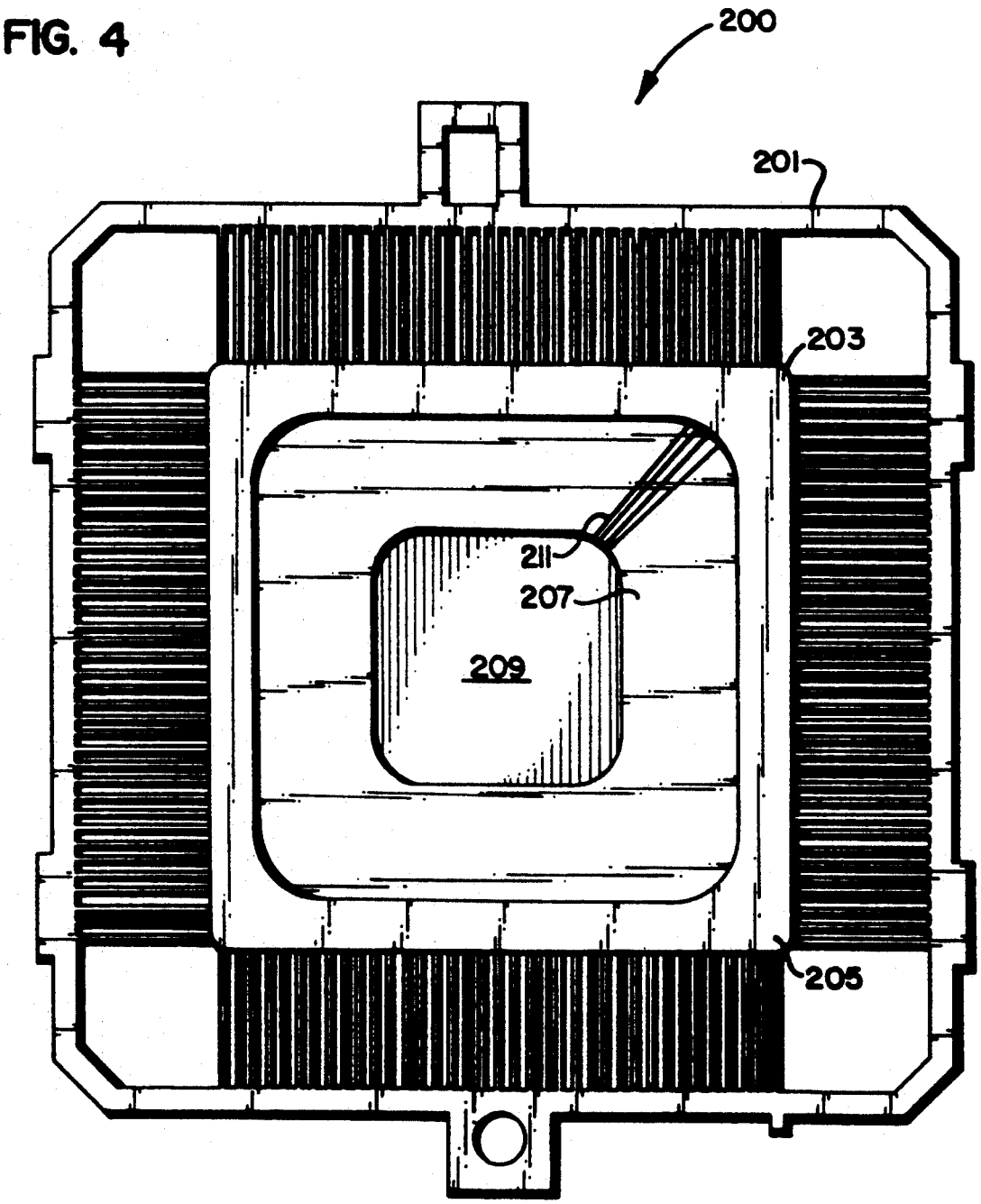
FIG. 4 is a top down view of an integrated circuit chip carrier and lead frame of the present invention.

The preferred embodiments of present invention are described in FIGS. 4-10. FIG. 4 shows a top down view of an integrated circuit chip carrier 200 which is similar to the carrier 100 shown in FIG. 1. The same type of lead frame 201 is used having an outer frame which is removed after the lid (not shown) is sealed to the substrate 203. An inner cavity 209 is provided into which the integrated circuit die will be placed and bonded for attachment to the leads 211. A patterned amount of adhesive glass 207 such as Dow Corning 7583 is positioned around the periphery of the cavity 209 to hold the leads 211 of the lead frame in position during construction. A narrow band of sealing glass 205 such as Kyocera KC400 is placed around the outer periphery of substrate 203 and on top of the leads 211 of the lead frame. Between the sealing glass 205 and the adhesive 207 there is no glass or adhesive between the leads. When the leads 211 of the lead frame are placed above the surface of substrate 203, the air bridge between adhesive 207 and sealing glass 205 allows an air gap between leads 211. Since air has the best dielectric constant for reducing capacitance, the air gap reduces the effective dielectric constant between the leads 211. A sufficient amount of sealing glass 205 remains to bond the lid (not shown) to the ceramic substrate 203.

Figure 5:
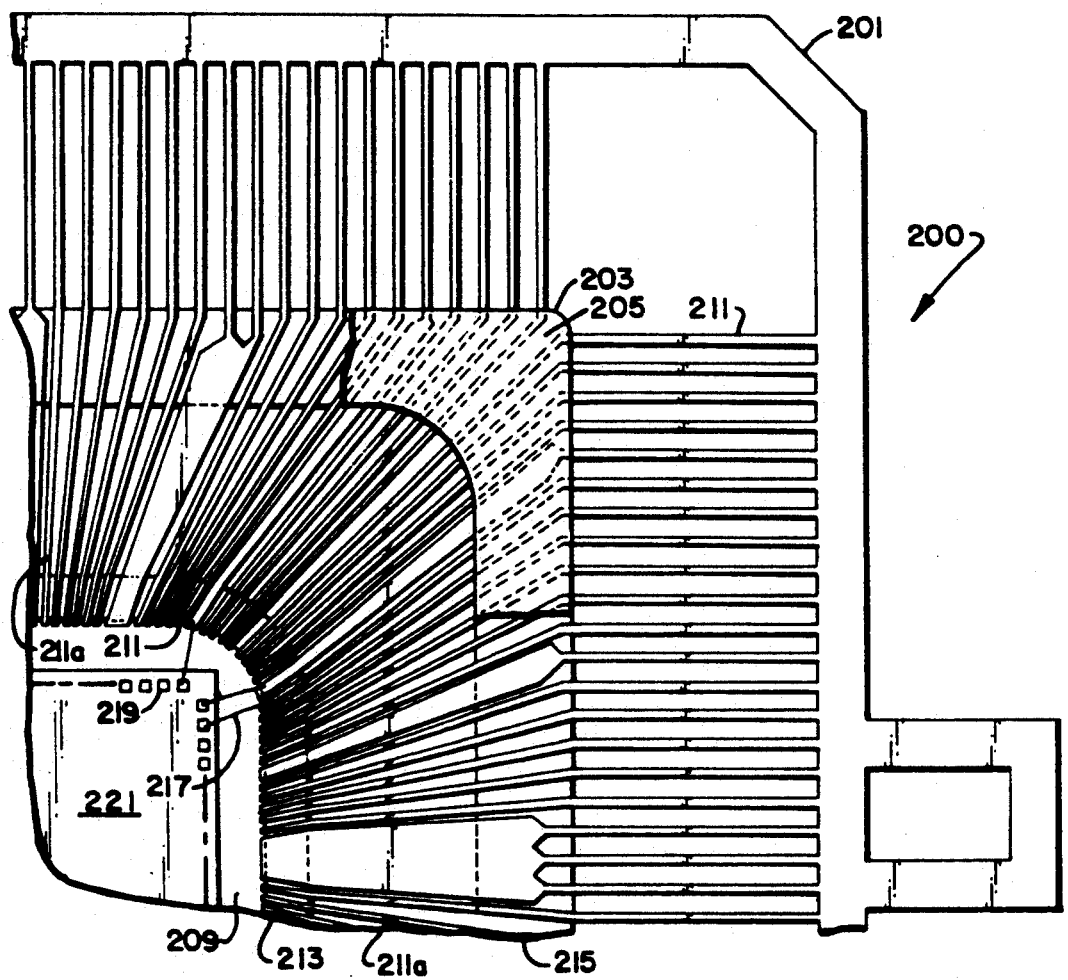
FIG. 5 is a detailed, cut-away view of a portion of a first preferred embodiment of the present invention of FIG. 4.

FIG. 5 shows a more detailed schematic view of the first preferred embodiment of the present invention. The integrated circuit die 221 is shown positioned in cavity 209. The leads 211 are attached and supported on the outer periphery 215 of the substrate 203, and on the inner periphery 213 of the substrate 203 by adhesive glass, forming an air gap between leads 211. Sealing glass 205 is then placed over the leads at the outer periphery of substrate 203 for attaching the lid to form a hermetic seal. The interlead capacitance of lead 211 at portion 211a is a function of the air dielectric rather than the dielectric constant of the sealing glass placed over the leads at outer periphery 205 or placed under the leads at an inner periphery 213 or outer periphery 215. Bonding wires 217 form the electrical connections between leads 211 and the bonding pads 219 of integrated circuit die 221.

Figure 6:
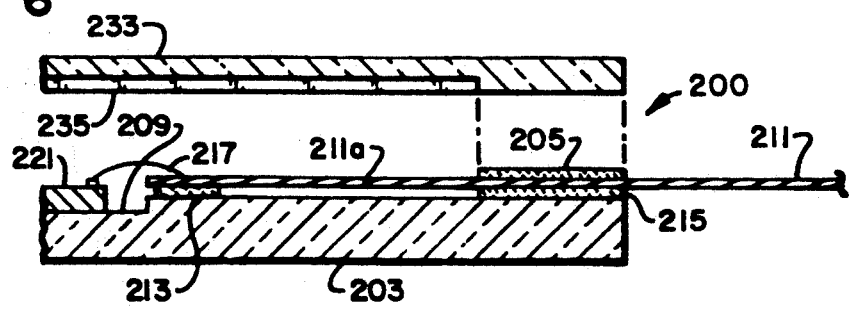
FIG. 6 is a detailed cut-away side view of the first preferred embodiment of the present invention of FIG. 5 also showing the lid.

FIG. 6 shows a side view of the schematic view of the integrated circuit chip carrier of FIG. 5. In this side view a lid 233 is shown in position to be affixed to the top surface of chip carrier 200 showing the completed integrated circuit chip carrier package with reduced interlead capacitance. The lid used in these types of carriers have recessed inner area 235 so that the lid does not contact the die 221 or any of the interior surfaces of the substrate 203.

Figure 7:
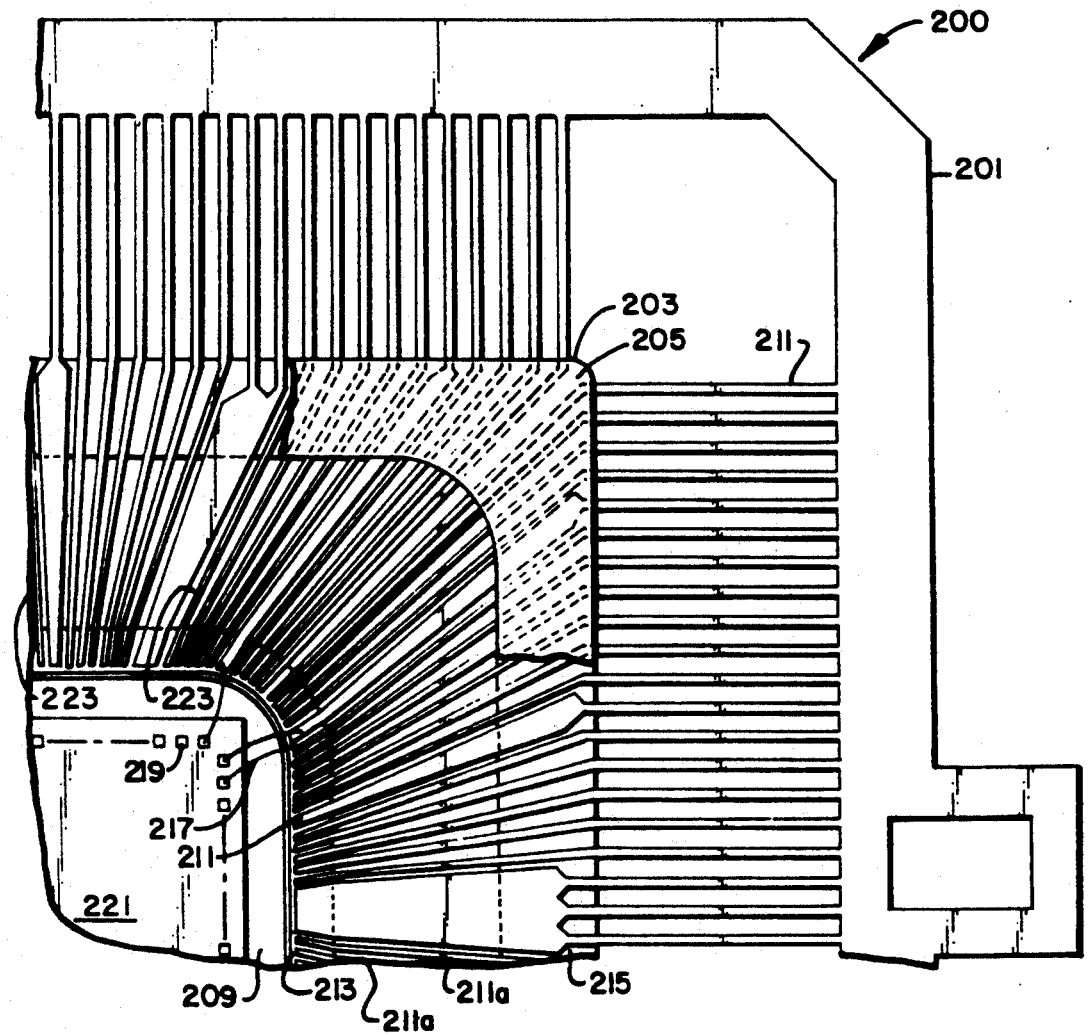
FIG. 7 is a top down view of a second preferred embodiment of the present invention of FIG. 4 showing the purposed trenching in schematic form.
Figure 8:
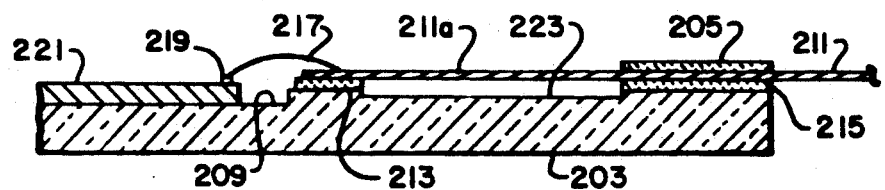
FIG. 8 is a detailed cut-away side view of the second preferred embodiment of the present invention of FIG. 7 also showing an integrated circuit attached.

The second preferred embodiment of the present invention is shown in FIGS. 7 and 8. FIG. 7 is a detailed view of a portion of the chip carrier 200 shown in FIG. 4. The second preferred embodiment of FIG. 7 and 8 is an additional improvement on the first preferred embodiment of FIGS. 5 and 6. An important feature of the present invention is the ability to control the interlead capacitance by controlling the amount of sealing glass and adhesive glass placed on the leads. Normally, if left unrestricted, the sealing glass (when melted to form the hermetic seal) will flow up to 15% of its original width. Thus, applying adhesive glass and sealing glass in a restricted pattern designed to restrict the sealing glass to the outer periphery of substrate 203 and outer periphery of cavity 209 would result in reduced interlead capacitance, however, the resultant interlead capacitance would be partially uncontrolled and unpredictable within a limited range due to the unpredictable flow of sealing glass from the outer periphery migrating to the inner periphery of the top of substrate 203 and the migration of the adhesive glass. Thus, some pins will have higher or lower capacitance than the mean.

To precisely control the migration of sealing glass during heating and adhesive glass during attachment of the leads, the second preferred embodiment of the present invention includes a channel 223 which will cause any excess sealing glass on outer periphery 205 to flow away from leads 211 at bridged portion 211a and into the channel. In addition, any excess sealing glass at the outer periphery 215 of the substrate 203 and at the outer periphery 213 of the cavity 209 will flow away from the leads and into the channel 223. In this fashion, excess sealing glass and adhesive is positioned in the channel 223 in the ceramic substrate 203 without upsetting the air gap between the leads 211 at bridged portion 211a. Since the dimensions of the channel can be controlled during fabrication of the substrate to 1% tolerance, the interlead capacitance contributable to the sealing glass geometry is predictable to 1% due to the restricted flow of the sealing glass and adhesive glass. Thus, the channel 223 provides a mechanism for not only creating an air gap between the leads, but also providing a sink area for excess sealing glass and adhesive glass to precisely control the amount of glass found covering or surrounding leads 211. Using identical dimensions of the prior art integrated circuit chip carrier 100 shown in FIGS. 1-3, a 125 mil air of channel gap 223 is formed second in the preferred embodiment between outer periphery 213 of cavity 209 and outer periphery 205 of substrate 203. Once again since air has the best dielectric constant the air gap serves to reduce the interlead capacitance to adjacent pins from 3.0 to 2.0 picofarads for this package. The capacitance contributable to the sealing glass using this construction technique is carefully controlled to be predictable within one percent tolerance.

Channel 223 may be constructed using a number of prior art techniques. The technique found to be most useful is to depress the channel 223 and the cavity 209 while the ceramic material is in its uncured or "green" state. This stamping precisely controls the dimensions of the channel 223 and the cavity 209 to within 1% tolerance of dimensions. After the ceramic substrate 203 is fired or cured, the dimensions do not change and the substrate retains the stamped shape. Alternate methods could be used for creating channel 223 such as milling or chemical etching.

Figure 9:
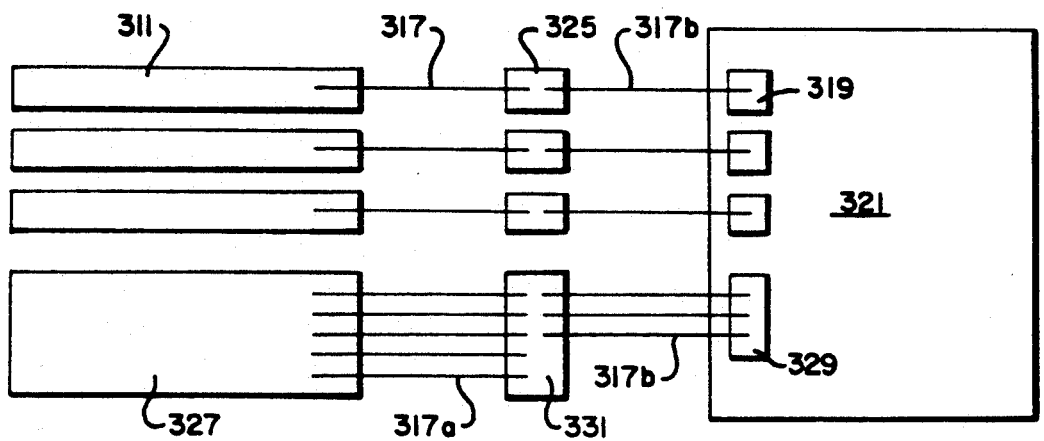
FIG. 9 is a top down view of a portion of an integrated circuit chip carrier utilizing a two step bonding operation with bonding islands to reduce interlead capacitance in a second embodiment of the present invention.
Figure 10:
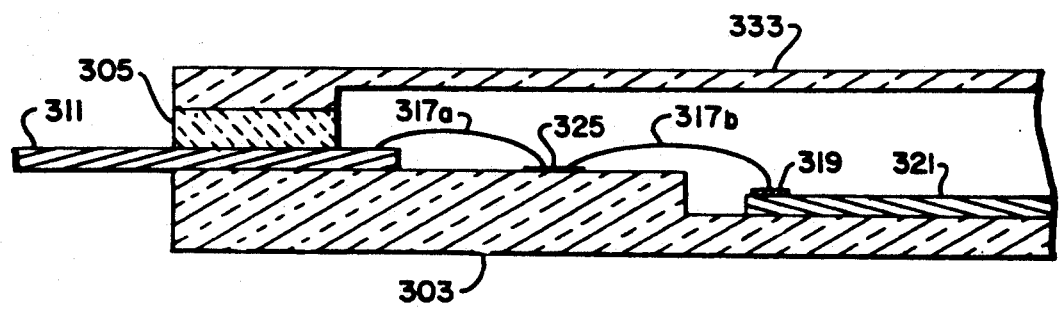
FIG. 10 is a side view of bonding island technique of FIG. 9.

A third or alternative embodiment which may be used to reduce interlead capacitance is shown in FIGS. 9 and 10. FIG. 9 shows a top down view of a double bonding wire technique using bonding wires 317a and 317b to bridge the gap between lead 311 and bonding pad 319 of integrated circuit die 321. A bonding island 325 allows the double bonding to take place, and helps to form an air gap between the leads. The bonding island is constructed on the surface of the ceramic substrate and may be constructed using any suitable metal. A power pin 327 is shown in FIG. 9 in which bonding wire 327a and 327b bridge the air gap between lead 327 and bonding pad 329. A plurality of bonding wires 317a and 317b are required due to the high current and low inductance requirements of power lead 327.

FIG. 10 shows a side view of the construction of FIG. 9. Lead 311 is bonded to substrate 303 by the sealing glass on the outer periphery 305. Bonding island 325 is used to bridge the gap between lead 311 and bonding pad 704. Bonding wires 317a and 317b form the electrical connection for the signal to propagate from lead 311 through bonding wire 317a across bonding island 325 through bonding wire 317b and onto bonding pad 319 of integrated circuit die 321. This results in an air dielectric between the bonding wires thus reducing the overall capacitance of the signal path. In addition, bonding wires are of smaller dimensions than the leads, which increases the spacing between the bonding wires and reduces interlead capacitance. The inductance of the bonding wires, however, is greater than the inductance of the leads which results in an overall increase in lead inductance. The overall capacitance of the signal is more difficult to predict than in the second embodiment described above since the migration or flowage of the sealing glass at the outer periphery 305 is difficult to control and hence results in a less predictable interlead capacitance when lid 333 is attached during heating.

While the present invention has been described in connection with the preferred embodiment thereof, it will be understood that many modifications will be readily apparent to those of ordinary skill in the art, and this application is intended to cover any adaptations or variations thereof. Therefore, it is manifestly intended that this invention be limited only by the claims and the equivalence thereof.

We claim:

1. A reduced-capacitance chip carrier package, comprising:
   a substrate having a planar surface, comprising:
   (a) a centrally located cavity depressed from said planar surface for receiving an integrated circuit chip;
   (b) a channel located concentric to said cavity and depressed from said planar surface;
   (c) such that a first surface area is defined on said planar surface between said cavity and said channel; and
   (d) such that a second surface area is defined on said planar surface between said channel and the periphery of said substrate; and
   a lead frame having a plurality of leads attached to said planar surface at said first surface area and at said second surface area and extending from the periphery of said cavity to the periphery of said substrate.

2. The package according to claim 1 further including adhesive means positioned on said first surface area for securing said leads to said first surface area.

3. The package according to claim 1 further including sealing means attached to said plurality of leads at said second surface area for later attachment to a lid to form a hermetic seal.

4. A method of constructing a reduced capacitance chip carrier package, comprising the steps of:
   (a) providing a substantially planar substrate having a planar surface;
   (b) identifying a centrally located position on said planar surface for placing an integrated circuit chip;
   (c) depressing a channel into said planar surface concentric to said centrally located position; and (d) attaching a plurality of leads to said planar surface such that said leads bridge said channel.

5. The method according to claim 4 wherein step d further includes the steps of:
(d1) applying adhesive to a portion of said substrate located between said centrally located position and said channel;
(d2) attaching said leads to said portion of said planar surface such that said leads bridge said channel; and
(d3) applying sealing glass to said leads at a second portion of said planar surface located between said channel and an outer periphery of said substrate.

6. The method according to claim 5 wherein said adhesive and said sealing glass are the same material and are applied concurrently.

7. The method according to claim 4, wherein step (c) includes the substep of chemical etching to form said channel.

8. The method according to claim 4, wherein step (c) includes the substep of milling to form said channel.

9. A method of reducing interlead capacitance on chip carrier packages, comprising the steps of:
(a) providing a substantially planar substrate having a defined periphery;
(b) locating a central position for placing an integrated circuit chip;
(c) forming a channel in said substrate material on said planar surface located between said centrally located position and the periphery of said substrate; and
(d) bridging a plurality of leads from said centrally located position to the periphery of said substantially planar substrate such that an air dielectric is maintained between said leads.

10. The method according to claim 9, wherein step (c) includes the substeps of:
(c1) stamping a channel into said substrate while said substrate is in an uncured state; and
(c2) curing said substrate.

11. The method according to claim 9, wherein step (c) includes the substep of chemical etching to form said channel.

12. The method according to claim 9, wherein step (c) includes the substep of milling to form said channel.

13. A reduced-capacitance chip carrier package, comprising:
a substrate having a substantially planar surface having defined periphery;
a centrally located position adapted for receiving an integrated circuit chip;
a channel formed in said surface and located between said position and the periphery of said substrate; and
a lead frame having a plurality of leads attached to said surface, said lead frame positioned such that at least a portion of said plurality of said leads bridge said channel.

14. The package according to claim 13, wherein said channel is concentric to said position.

15. The package according to claim 13, wherein said channel is adjacent said position.

16. The package according to claim 13, further including adhesive means positioned on said surface at the periphery of said cavity for attaching said lead frame to said substrate.

17. The package according to claim 16, further including sealing means positioned on said surface for attaching a lid to form a hermetic seal.

18. The package according to claim 16, wherein said adhesive means is positioned on the outer periphery of said surface for further attaching a lid to form a hermetic seal.

19. A reduced-capacitance chip carrier package, comprising:
a substrate having a substantially planar surface and a defined periphery;
a centrally located cavity depressed from said surface of said substrate for receiving an integrated circuit chip;
a plurality of channels depressed from said surface and located between said cavity and the periphery of said substrate; and
a lead frame having a plurality of leads attached to said surface, said lead frame positioned such that at least one of said leads bridges at least one of said channels.

20. The package according to claim 19, further including adhesive means positioned on said surface for attaching said lead frame to said substrate.

21. The package according to claim 19, further including sealing means positioned on said surface for attaching a lid to form a hermetic seal.

* * * * *

UNITED STATES PATENT AND TRADEMARK OFFICE
CERTIFICATE OF CORRECTION

PATENT NO. : 5,134,247

DATED : July 28, 1992

INVENTOR(S) : David Duxstad et al.

It is certified that error appears in the above-identified patent and that said Letters Patent is hereby corrected as shown below:

Title page,
    item (75), Inventors, Order of Inventors should read as follows as granted by Examiner on January 31, 1992: "Peter J. Wehner, Paul M. Knudsen, David F. Leonard, Richard R. Steitz, David L. Duxstad, Melvin C. August, Delvin D. Eberlein" should read --David L. Duxstad, Melvin C. August, Delvin D. Eberlein, P. Michael Knudsen, David F. Leonard, Richard R. Steitz, Peter J. Wehner--.

item (73), Assignee, "Eagen" should read --Minneapolis--.

Column 2, lines 16 and 17, "compacitance" should read --capacitance--.

Column 2, line 35, "non-bridge" should read --nonbridged--.

Column 4, line 5, insert --the-- after the word "of".

Column 4, line 59, "Fig." should read --Figs.--.

UNITED STATES PATENT AND TRADEMARK OFFICE
CERTIFICATE OF CORRECTION

PATENT NO. : 5,134,247
DATED : July 28, 1992
INVENTOR(S) : David Duxstad, et. al.

It is certified that error appears in the above-indentified patent and that said Letters Patent is hereby corrected as shown below:

Column 5, line 67, "wire" should read --wires--.

Signed and Sealed this

Ninth Day of November, 1993

Attest:

BRUCE LEHMAN

*Attesting Officer*   *Commissioner of Patents and Trademarks*